United States Patent
Kim et al.

(10) Patent No.: US 12,107,035 B2
(45) Date of Patent: Oct. 1, 2024

(54) SEMICONDUCTOR DEVICE WITH A SEMICONDUCTOR DIE EMBEDDED BETWEEN AN EXTENDED SUBSTRATE AND A BOTTOM SUBSTRATE

(71) Applicant: Amkor Technology Singapore Holding Pte. Ltd., Singapore (SG)

(72) Inventors: Jae Yun Kim, Gyeonggi-do (KR); Gi Tae Lim, Gyeonggi-do (KR); Woon Kab Jung, Seoul (KR); Ju Hoon Yoon, Gyeonggi-do (KR); Dong Joo Park, Incheon (KR); Byong Woo Cho, Seoul (KR); Gyu Wan Han, Seoul (KR); Ji Young Chung, Gyeonggi-do (KR); Jin Seong Kim, Gyeonggi-do (KR); Do Hyun Na, Seoul (KR)

(73) Assignee: Amkor Technology Singapore Holdings Pte. Ltd., Singapore (SG)

( * ) Notice: Subject to any disclaimer, the term of this patent is extended or adjusted under 35 U.S.C. 154(b) by 0 days.

(21) Appl. No.: 17/897,556

(22) Filed: Aug. 29, 2022

(65) Prior Publication Data

US 2022/0415769 A1    Dec. 29, 2022

Related U.S. Application Data

(63) Continuation of application No. 16/148,178, filed on Oct. 1, 2018, now Pat. No. 11,430,723, which is a
(Continued)

(30) Foreign Application Priority Data

Sep. 25, 2013 (KR) .......................... 10-2013-0113840

(51) Int. Cl.
*H01L 23/498* (2006.01)
*H01L 21/50* (2006.01)
(Continued)

(52) U.S. Cl.
CPC ........ *H01L 23/49811* (2013.01); *H01L 21/50* (2013.01); *H01L 23/3128* (2013.01);
(Continued)

(58) Field of Classification Search
CPC ......... H01L 24/18; H01L 24/28; H01L 24/82; H01L 24/83
(Continued)

(56) References Cited

U.S. PATENT DOCUMENTS 8,304,880 B2    11/2012  Chow et al.
8,816,404 B2     8/2014  Kim et al.
(Continued)

FOREIGN PATENT DOCUMENTS

JP    2004-273938            9/2014
KR    20090071386 A    *    7/2009
(Continued)

OTHER PUBLICATIONS

Office Action corresponding to Korean Patent Application No. 10-2013-0113840 dated Dec. 22, 2014.
(Continued)

*Primary Examiner* — Hoai V Pham
(74) *Attorney, Agent, or Firm* — McAndrews, Held & Malloy, Ltd.

(57) ABSTRACT

A method of manufacturing a semiconductor device having a semiconductor die within an extended substrate and a bottom substrate may include bonding a bottom surface of a semiconductor die to a top surface of a bottom substrate, forming an adhering member to a top surface of the semiconductor die, bonding an extended substrate to the semiconductor die and to the top surface of the bottom substrate utilizing the adhering member and a conductive bump on a bottom surface of the extended substrate and a conductive bump on the bottom substrate. The semiconductor die and
(Continued)

the conductive bumps may be encapsulated utilizing a mold member. The conductive bump on the bottom surface of the extended substrate may be electrically connected to a terminal on the top surface of the extended substrate. The adhering member may include a laminate film, a non-conductive film adhesive, or a thermal hardening liquid adhesive.

20 Claims, 15 Drawing Sheets

Related U.S. Application Data continuation of application No. 14/496,764, filed on Sep. 25, 2014, now Pat. No. 10,090,230.

(51) Int. Cl.
    *H01L 23/00* (2006.01)
    *H01L 23/31* (2006.01)
    *H01L 23/538* (2006.01)

(52) U.S. Cl.
    CPC .. *H01L 23/49827* (2013.01); *H01L 23/49833* (2013.01); *H01L 23/5389* (2013.01); *H01L 24/92* (2013.01); *H01L 24/73* (2013.01); *H01L 24/81* (2013.01); *H01L 24/83* (2013.01); *H01L 2224/131* (2013.01); *H01L 2224/1329* (2013.01); *H01L 2224/133* (2013.01); *H01L 2224/16227* (2013.01); *H01L 2224/2919* (2013.01); *H01L 2224/2929* (2013.01); *H01L 2224/293* (2013.01); *H01L 2224/32225* (2013.01); *H01L 2224/73253* (2013.01); *H01L 2224/81815* (2013.01); *H01L 2224/83191* (2013.01); *H01L 2224/83203* (2013.01); *H01L 2224/8321* (2013.01); *H01L 2224/92225* (2013.01); *H01L 2224/92242* (2013.01); *H01L 2924/181* (2013.01); *H01L 2924/18161* (2013.01)

(58) Field of Classification Search
    USPC .................................................. 257/437, 780
    See application file for complete search history.

(56) References Cited

U.S. PATENT DOCUMENTS

| | | |
|---|---|---|
| 9,036,362 B2 | 5/2015 | Tanaka et al. |
| 9,070,627 B2 | 6/2015 | Zhao et al. |
| 2006/0151206 A1 | 7/2006 | Maruyama et al. |
| 2010/0237495 A1 | 9/2010 | Pagalia |
| 2012/0038053 A1 | 2/2012 | Oh |
| 2012/0061854 A1 | 3/2012 | Chow et al. |
| 2012/0319284 A1 | 12/2012 | Ko |
| 2013/0069239 A1 | 3/2013 | Kim |
| 2013/0075894 A1 | 3/2013 | Gallegos |
| 2013/0249106 A1 | 9/2013 | Lin |
| 2013/0280826 A1 | 10/2013 | Scanian |
| 2014/0063764 A1 | 3/2014 | Tanaka et al. |
| 2014/0168014 A1 | 6/2014 | Chih |
| 2015/0069637 A1 | 3/2015 | Zhao et al. |

FOREIGN PATENT DOCUMENTS

| | | |
|---|---|---|
| KR | 10-2012-0094712 | 8/2012 |
| KR | 10-1171842 | 8/2012 |
| TW | 201121009 | 6/2011 |

OTHER PUBLICATIONS

Office Action for Application No. TW10-3133198 dated Jul. 11, 2016.

Office Action for Application No. TW10-3133198 dated May 22, 2017.

* cited by examiner

SEMICONDUCTOR DEVICE WITH A SEMICONDUCTOR DIE EMBEDDED BETWEEN AN EXTENDED SUBSTRATE AND A BOTTOM SUBSTRATE

CROSS-REFERENCE TO RELATED APPLICATIONS

This application is a continuation of U.S. patent application Ser. No. 16/148,178, filed Oct. 1, 2018, which issued as U.S. Pat. No. 11,430,723; which is a continuation of U.S. patent application Ser. No. 14/496,764, filed Sep. 25, 2014, which issued as U.S. Pat. No. 10,090,230; which makes reference to, claims priority to, and claims the benefit of Korean Patent Application No. 10-2013-0113840, filed on Sep. 25, 2013, the contents of each of which are hereby incorporated herein by reference, in their entirety.

FIELD

Certain embodiments of the disclosure relate to semiconductor chip packaging. More specifically, certain embodiments of the disclosure relate to a semiconductor device with a semiconductor die embedded between an extended substrate and a bottom substrate.

BACKGROUND

Recently, as the market for electronic devices such as smart phones and smart pads grows exponentially, demands for a semiconductor package which can be applied to light, thin, short and small products are gradually increasing as well.

Further limitations and disadvantages of conventional and traditional approaches will become apparent to one of skill in the art, through comparison of such systems with the present disclosure as set forth in the remainder of the present application with reference to the drawings.

BRIEF SUMMARY

A semiconductor device comprising a semiconductor die embedded between an extended substrate and a bottom substrate, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1:
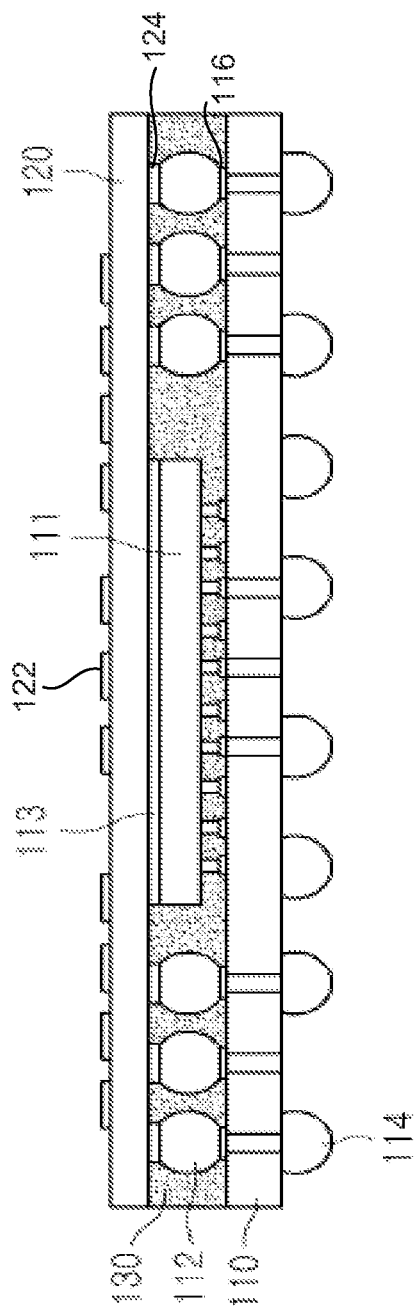
FIG. 1 is a cross-sectional view of a semiconductor package, in accordance with the present disclosure.

Certain aspects of the disclosure may be found in a semiconductor device comprising a semiconductor die embedded between an extended substrate and a bottom substrate. Example aspects of the disclosure may comprise bonding a bottom surface of a semiconductor die to a top surface of a bottom substrate, forming an adhering member on a top surface of the semiconductor die, bonding an extended substrate to the semiconductor die and to the top surface of the bottom substrate utilizing the adhering member and a conductive bump on a bottom surface of the extended substrate and/or a conductive bump on the bottom substrate. The semiconductor die and the conductive bump(s) may be encapsulated utilizing a mold member. The conductive bump on the bottom surface of the extended substrate may be electrically connected to a terminal on the top surface of the extended substrate. Conductive bumps may also be formed on a bottom surface of the bottom substrate. The adhering member may for example comprise one or more of: a laminate film, a non-conductive film adhesive, and/or a thermal hardening liquid adhesive. The extended substrate may comprise an interposer.

Various aspects of the present disclosure may be embodied in many different forms and should not be construed as being limited to the example embodiments set forth herein. Rather, these example embodiments of the disclosure are provided so that this disclosure will be thorough and complete and will fully convey various aspects of the disclosure to those skilled in the art.

In the drawings, the thickness of layers and regions may be exaggerated for clarity. Here, like reference numerals refer to like elements throughout. As used herein, the term "and/or" includes any and all combinations of one or more of the associated listed items.

In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises" and/or "comprising," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

FIG. 1 is a cross-sectional view of a semiconductor package in accordance with the present disclosure. The example semiconductor package comprises a bottom substrate 110, on which a plurality of bottom conductive bumps 112 are formed. The bottom conductive bumps 112 may, for example, provide electrical connectivity to a semiconductor die 111 and various bottom I/O (Input/Output) features (e.g., connecting pads, traces, conductive vias, redistribution layers, etc.). The bottom conductive bumps 112 may, for example, comprise any of a variety of conductive structures. For example, the bottom conductive bumps 112 may comprise conductive balls (e.g., solder balls, coated copper balls, solder-coated copper balls, gold balls, etc.), conductive posts or pillars (e.g., plated pillars, plated copper pillars, solder pillars, solder caps or balls on posts or pillars, etc.), conductive epoxy structures, etc.

The bottom substrate 110 may also comprise bottom connecting pads 116 for receiving the conductive bumps 112 and for receiving metal contacts on the semiconductor die 111. The bottom connecting pads 116 may, for example, comprise any of a variety of configurations (e.g., flat, bumped, dimpled, concave, convex, round, circular, square, elliptical, etc.).

The semiconductor package may also comprise an adhering member 113 which may for example be formed on the top of the semiconductor die 111 and physically adhered to the bottom of an extended substrate 120. Conversely, the adhering member 113 may for example be formed on the bottom of the extended substrate 120 and then adhered to the top of the semiconductor die 111. The adhering member 113 may comprise any of a variety of characteristics. For example, the adhering member 113 may comprise a heat-conductive and/or electrically conductive epoxy. Also for example, the adhering member 113 may comprise a thermal interface material. Further for example, the adhering member 113 may comprise an insulating adhesive material. The adhering member 113, for example, may comprise one or more of a laminate film, a thermal hardening liquid adhesive, and/or an NCF (Non Conductive Film) adhesive.

The extended substrate 120 may, for example, comprise an interposer that provides routing between a plurality of the bottom I/O features, such as bottom connecting pads 116 formed on the bottom substrate 110, and terminals 122 on a top surface of the extended substrate 120. Such an interposer may, for example, comprise a multi-layer structure with conducting and insulating materials and may provide for the formation of I/O terminals (e.g., the terminals 122) on any portion(s) or all of the top surface of the extended substrate 120. For example, such I/O terminals may be formed in the inner space or within the footprint of a semiconductor die (or a chip) of a package that is coupled to the top of the extended substrate 120 and/or in the outer space or outside of the footprint of such a semiconductor die. Also for example, such I/O terminals may be formed within and/or outside of the footprint of the semiconductor die 111 (e.g., on the extended substrate 120 directly above the semiconductor die 111 and/or on the extended substrate 120 and laterally displaced from the semiconductor die 111).

The extended substrate 120 may, for example, comprise top connecting pads 124 for receiving the bottom conductive bumps 112. The top connecting pads 124 may, for example, comprise any of a variety of configurations (e.g., flat, bumped, dimpled, convex, concave, round, circular, square, elliptical, etc.). In an example implementation, a plurality of the bottom conductive bumps 112 may be utilized to physically and/or electrically connect the top connecting pads 124 to respective bottom connecting pads 116.

Further, a mold member 130, for example encapsulating the semiconductor die 111, a plurality of the bottom conductive bumps 112, a plurality of the bottom connecting pads 116, and/or a plurality of the top connecting pads 124 on the extended substrate 120, may be formed between the bottom substrate 110 and the extended substrate 120. The mold member 130 may, for example, comprise any of a variety of mold compounds and/or be formed utilizing any of a variety of molding techniques.

On the bottom of the bottom substrate 110, a plurality of conductive bumps 114 may be formed for physical/electrical connection of the semiconductor package to another substrate, for example a motherboard (not shown). The conductive bumps 114 may, for example, comprise any of a variety of conductive structures. For example, the conductive bumps 114 may comprise conductive balls (e.g., solder balls, coated copper balls, solder-coated copper balls, gold balls, etc.), conductive posts or pillars (e.g., plated pillars, plated copper pillars, solder pillars, solder caps or balls on posts or pillars, etc.), conductive epoxy structures, etc.

The mold member 130 may, for example, be formed through a molding process at various stages of production. For example, the mold member 130 may be formed after the bottom substrate 110 and the extended substrate 120 are coupled to each other. Also for example, the mold member 130 may be formed between forming the semiconductor die 111 and/or a plurality of the bottom conductive bumps 112 on the bottom substrate 110, and forming the adhering member 113 on the top of the semiconductor die 111.

As shown in FIGS. 1-5, an example semiconductor package of the present disclosure may connect between each of a plurality of I/O features on the bottom substrate 110 and corresponding respective I/O feature on the extended substrate 120 utilizing various connecting structures (or methods) and/or combinations thereof. For example, such connecting structures may comprise a ball-to-ball structure, a ball-to-post structure, a post-to-ball structure, a post-to-post method, etc. The example packages shown in FIGS. 2-5 and in FIGS. 6-9 may, for example, share any or all characteristics with the example package shown in FIG. 1 and discussed herein.

Figure 2:
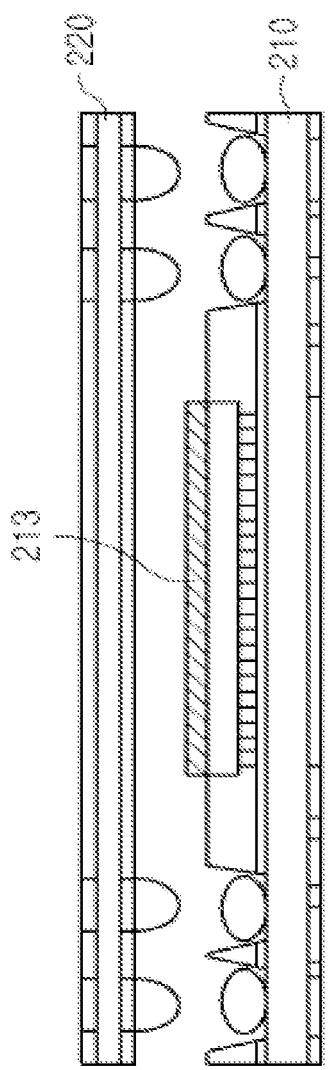
FIG. 2 is a cross-sectional view illustrating a semiconductor package which includes two substrates coupled to each other in a ball-to-ball method, in accordance with the present disclosure.

FIG. 2 is a cross-sectional view illustrating a semiconductor package comprising two substrates coupled to each other utilizing a ball-to-ball structure (or method), in accordance with the present disclosure. FIG. 2 illustrates a structure in which each I/O feature on a bottom substrate 210 and each I/O feature on an extended substrate 220 may be connected utilizing a ball-to-ball structure (or method).

In FIG. 2, conductive balls formed on the bottom substrate 210 may be defined (or referred to) as bottom conductive balls, and conductive balls formed on the extended substrate 220 may be defined (or referred to) as rerouting conductive balls. The conductive balls utilized in the ball-to-ball attachment illustrated in FIG. 2 may, for example, comprise characteristics of any of a variety of conductive balls (e.g., solder balls, coated copper balls, solder-coated copper balls, gold balls, etc.). The adhering member 213 may be utilized to adhere (or otherwise fix) a semiconductor die formed on (e.g., attached to) the bottom substrate 210 to a bottom part of the extended substrate 220.

Figure 3:
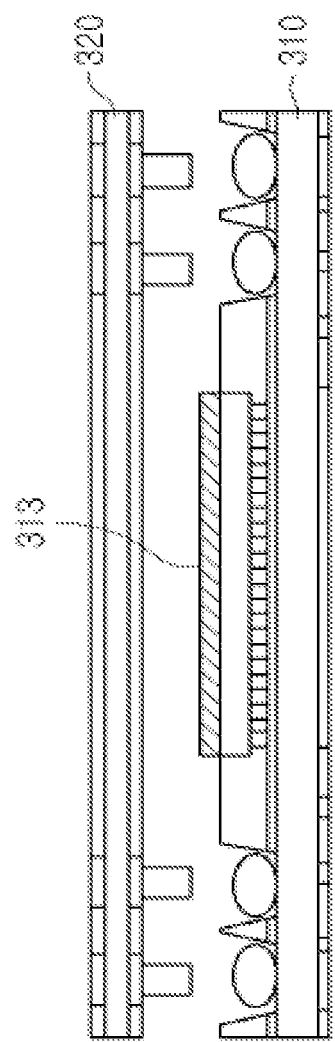
FIG. 3 is a cross-sectional view illustrating a semiconductor package which includes two substrates coupled to each other in a ball-to-post method, in accordance with the present disclosure.

FIG. 3 is a cross-sectional view illustrating a semiconductor package comprising two substrates coupled to each other utilizing a ball-to-post structure (or method), in accordance with the present disclosure. FIG. 3 illustrates a structure in which each I/O feature on a bottom substrate 310 and each I/O feature on an extended substrate 320 may be connected utilizing a ball-to-post structure (or method).

In FIG. 3, conductive balls formed on the bottom substrate 310 may be defined (or referred to) as bottom conductive balls, and conductive posts (or pillars) formed on the extended substrate 320 may be defined (or referred to) as rerouting conductive posts. The conductive balls utilized in the ball-to-post attachment illustrated in FIG. 3 may, for example, comprise characteristics of any of a variety of conductive balls (e.g., solder balls, coated copper balls, solder-coated copper balls, gold balls, etc.). The conductive posts (or pillars) utilized in the ball-to-post attachment illustrated in FIG. 3 may, for example, comprise characteristics of any of a variety of conductive posts or pillars (e.g., plated pillars, plated copper pillars, solder pillars, solder-capped pillars or posts, etc.). The adhering member 313 in FIG. 3 may be utilized to adhere (or otherwise fix) a semiconductor die formed on (e.g., attached to) the bottom substrate 310 to a bottom part of the extended substrate 320.

Figure 4:
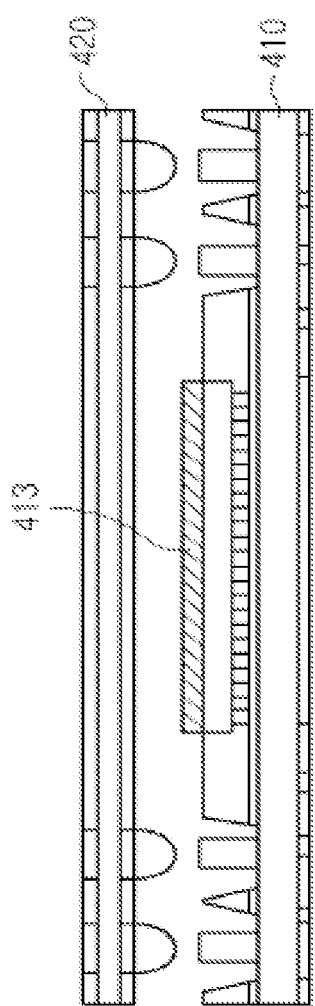
FIG. 4 is a cross-sectional view illustrating a semiconductor package which includes two substrates coupled to each other in a post-to-ball method, in accordance with the present disclosure.

FIG. 4 is a cross-sectional view illustrating a semiconductor package comprising two substrates coupled to each other utilizing a post-to-ball structure (or method), in accordance with the present disclosure. FIG. 4 illustrates a structure in which each I/O feature on a bottom substrate 410 and each I/O feature on an extended substrate 420 may be connected utilizing a post-to-ball structure (and/or method).

In FIG. 4, conductive posts formed on the bottom substrate 410 may be defined (or referred to) as bottom conductive posts, and conductive balls formed on the extended substrate 420 may be defined (or referred to) as rerouting conductive balls. The conductive posts (or pillars) utilized in the post-to-ball attachment illustrated in FIG. 4 may, for example, comprise characteristics of any of a variety of conductive posts or pillars (e.g., plated pillars, plated copper pillars, solder pillars, solder-capped pillars or posts, etc.). The conductive balls utilized in the post-to-ball attachment illustrated in FIG. 3 may, for example, comprise characteristics of any of a variety of conductive balls (e.g., solder balls, coated copper balls, solder-coated copper balls, gold balls, etc.). The adhering member 413 may be utilized to adhere (or otherwise fix) a semiconductor die formed on the bottom substrate 410 to a bottom part of the extended substrate 420.

Figure 5:
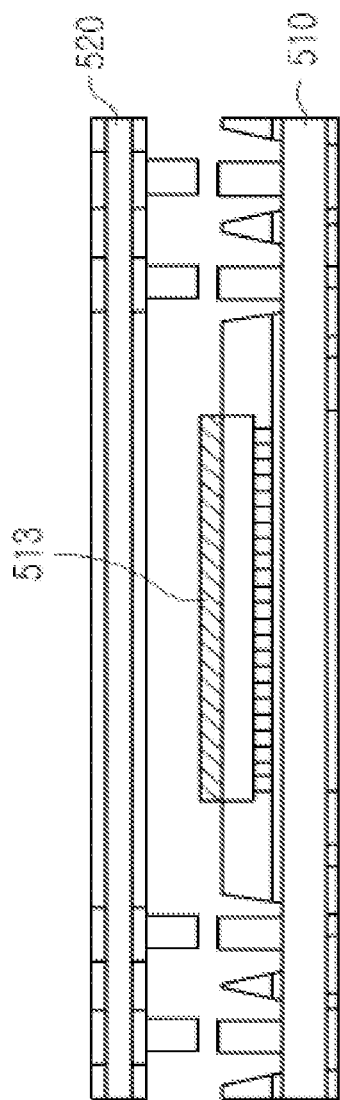
FIG. 5 is a cross-sectional view illustrating a semiconductor package which includes two substrates coupled to each other in a post-to-post method, in accordance with the present disclosure.

FIG. 5 is a cross-sectional view illustrating a semiconductor package comprising two substrates coupled to each other in a post-to-post structure (or method), in accordance with the present disclosure. FIG. 5 illustrates a structure in which each I/O feature on a bottom substrate 510 and each I/O feature on an extended substrate 520 may be connected utilizing a post-to-post structure (or method).

In FIG. 5, conductive posts formed on the bottom substrate 510 may be defined (or referred to) as bottom conductive posts, and posts formed on the extended substrate 520 may be defined (or referred to) as rerouting conductive posts. The conductive posts (or pillars) utilized in the ball-to-post attachment illustrated in FIG. 5 may, for example, comprise characteristics of any of a variety of conductive posts or pillars (e.g., plated pillars, plated copper pillars, solder pillars, solder-capped pillars or posts, etc.) The adhering member 513 may be utilized to adhere (or otherwise fix) a semiconductor die formed on the bottom substrate 510 to a bottom part of the extended substrate 520.

The discussion of FIGS. 6-9 will present various method and/or structural aspects with regard to the semiconductor package illustrated in FIG. 1 and discussed herein. It should be noted that any or all of the aspects of FIGS. 6-9 also apply to the semiconductor packages illustrated in FIGS. 2-5 and discussed herein.

FIGS. 6A to 6E are process flow diagrams illustrating processes of manufacturing a semiconductor package, in accordance with an embodiment of the present disclosure. FIGS. 6A-6E provide an example of a manner in which the semiconductor package of FIG. 1 may be produced, and thus similar component numbering is utilized. It should be understood that similarly named and/or numbered components in FIGS. 1 and 6A-6E may, for example, share any or all characteristics with one another. Additionally, as stated herein, any or all of the aspects of FIG. 6 also apply to manufacturing semiconductor packages illustrated in FIGS. 2-5 and discussed herein.

Figures 6A, 6B:
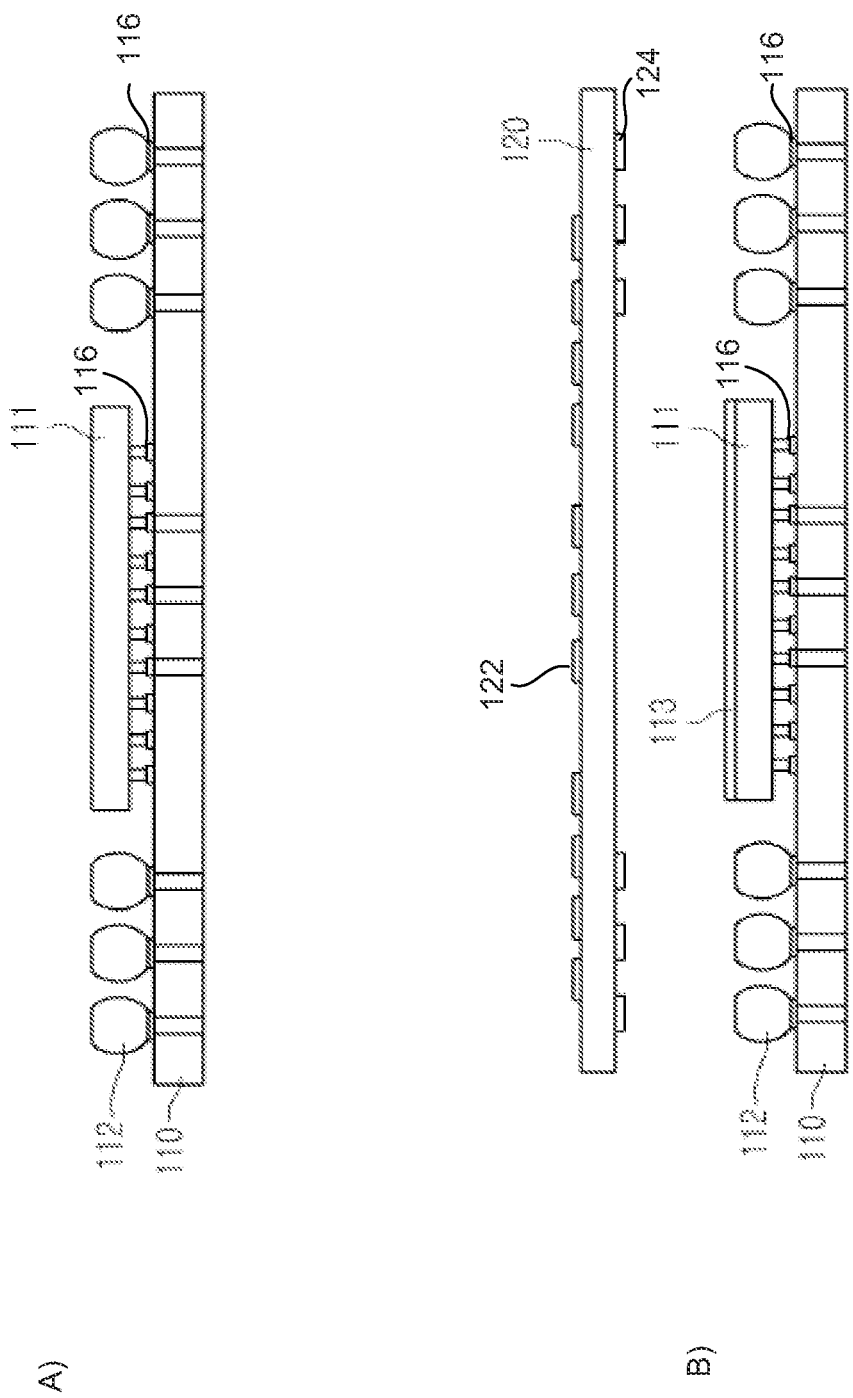
FIGS. 6A to 6E are process flow diagrams illustrating processes of manufacturing a semiconductor package, in accordance with an embodiment of the present disclosure.

Referring to FIG. 6A, a semiconductor die 111 may be attached to a bottom substrate 110. For example, metal contacts on the semiconductor die 111 may be attached to connecting pads 116 on the bottom substrate 110 that are configured to couple to the metal contacts. Such attachment may, for example, be performed utilizing a solder process (e.g., oven reflow, thermo-compression bonding, conductive adhesive bonding, etc.

A plurality of bottom conductive bumps 112 may be formed on other connecting pads 116 of the bottom substrate 110 that are configured to receive (or couple to) the conductive bumps 112. Such attachment may, for example, be performed utilizing a reflow or partial reflow process, conductive adhesive bonding, etc. The bottom conductive bumps 112 may, for example, comprise any of a variety of conductive structures. For example, the bottom conductive bumps 112 may comprise conductive balls (e.g., solder balls, coated copper balls, solder-coated copper balls, gold balls, etc.), conductive posts or pillars (e.g., plated pillars, plated copper pillars, solder pillars, solder-capped pillars or posts, etc.), conductive epoxy structures, etc.

Next, as illustrated in FIG. 6B, an adhering member 113 may be formed on the top of the semiconductor die 111. Such forming may, for example, comprise dispensing, printing, etc. For example, the adhering member 113 may comprise a heat-conductive and/or electrically conductive epoxy. Also for example, the adhering member 113 may comprise a thermal interface material. Further for example, the adhering member 113 may comprise an insulating adhesive material. The adhering member 113, for example, may comprise one or more of a laminate film, a thermal hardening liquid adhesive, and/or an NCF (Non Conductive Film) adhesive.

Additionally, a plurality of top connecting pads 124 (or other I/O features) may be formed on a bottom surface of the extended substrate 120. Further, terminals 122 may be formed on a top surface of the extended substrate 120. The extended substrate 120 may, for example, comprise an interposer, redistribution layer, and/or other structure that routes signals between the top connecting pads 124 and the terminals 122.

The extended substrate 120 may be placed at a target position (e.g., a target position for coupling to the bottom substrate 110). Such placement may, for example, be performed with single-package components and/or with panels prior to excising.

Figure 6C:
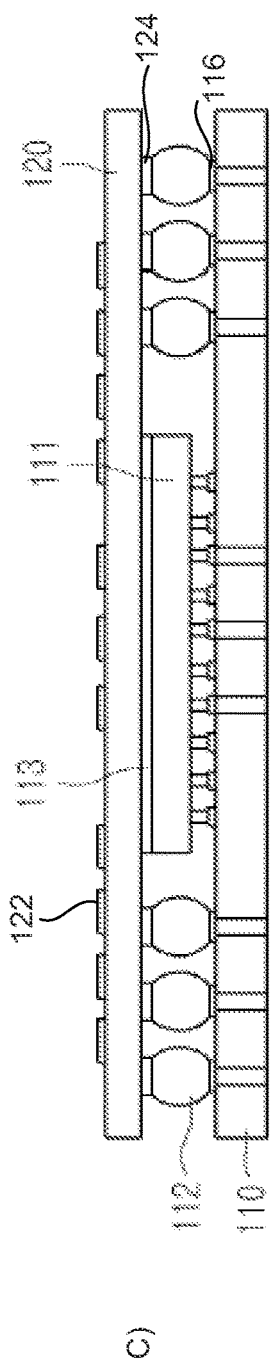

Subsequently, the top connecting pads 124 on the extended substrate 120 and their corresponding bottom conductive bumps 112 on the bottom substrate 110 may be placed in contact with each other, and the bottom part of the extended substrate 120 and the adhering member 113 may be placed in contact with each other. By then performing a reflow and/or bonding process, the bottom substrate 110 and the extended substrate 120 may be physically and/or electrically coupled to each other, as illustrated in FIG. 6C for example. Accordingly, the top of the semiconductor die 111 and a bottom part of the extended substrate 120 may be physically adhered (or otherwise fixed) by the adhering member 113.

Figure 6D:
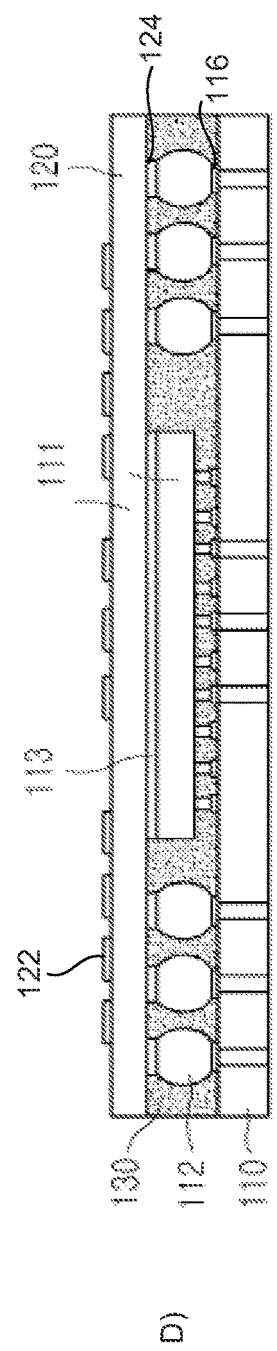

Thereafter, by performing a molding process, the semiconductor die 111 formed between the bottom substrate 110 and the extended substrate 120, a plurality of the bottom conductive bumps 112, a plurality of the bottom connecting pads 116, and/or a plurality of the top connecting pads 124 may be encapsulated by a mold member 130 as illustrated in FIG. 6D. The mold member 130 may, for example, comprise any of a variety of mold compounds and/or be formed utilizing any of a variety of molding techniques. Additionally, through a following series of processes, a top substrate, on which a semiconductor die and a plurality of conductive bumps are formed, may be stacked on the top of the extended substrate 120.

Figure 6E:
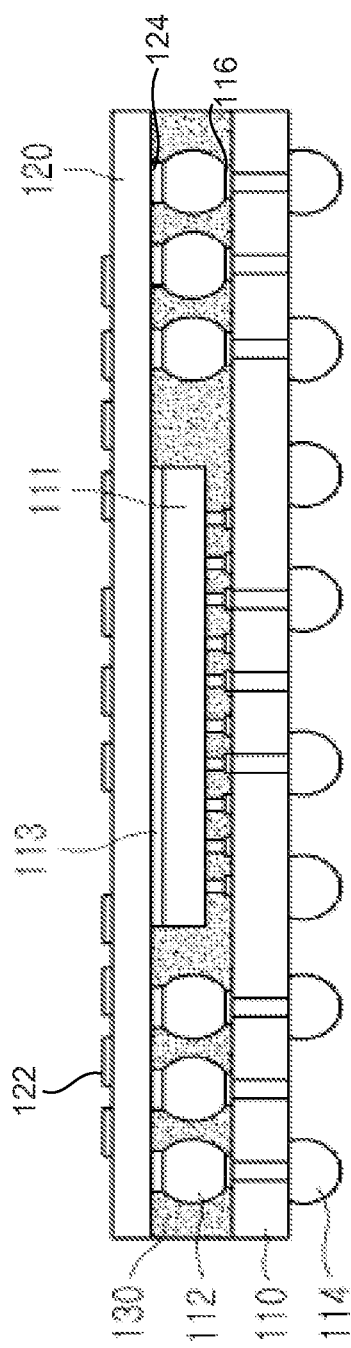

Lastly, by performing a ball drop (or placement) and a reflow process, a plurality of conductive bumps 114, as illustrated in FIG. 6E, may be formed on a plurality of connecting pads formed on the bottom of the bottom substrate 110 for physical/electrical connection to another substrate, for example a motherboard (not shown).

As described herein, the embodiments of the present disclosure in FIGS. 6A-6E illustrate by way of example a Fan-in package-on-package (PoP) structure, in which a semiconductor die formed between a bottom substrate and an extended substrate, and a plurality of bottom conductive bumps may be encapsulated by a mold member. However, the embodiments of the present disclosure are not necessarily limited to this arrangement. It should also be understood that the embodiments may also be applied in the same way to a package structure not forming a mold member (i.e., a package structure in which a mold member is not inserted between two substrates).

FIGS. 7A to 7E are process flow diagrams illustrating processes of manufacturing a semiconductor package, in accordance with another embodiment of the present disclosure. FIGS. 7A-7E provide an example of a manner in which the semiconductor package of FIG. 1 may be produced, and thus similar component numbering is utilized. It should be understood that similarly named and/or numbered components in FIGS. 1 and 7A-7E may, for example, share any or all characteristics with one another. Additionally, as stated herein, any or all of the aspects of FIG. 7 also apply to manufacturing semiconductor packages illustrated in FIGS. 2-5 and discussed herein.

Figures 7A, 7B:
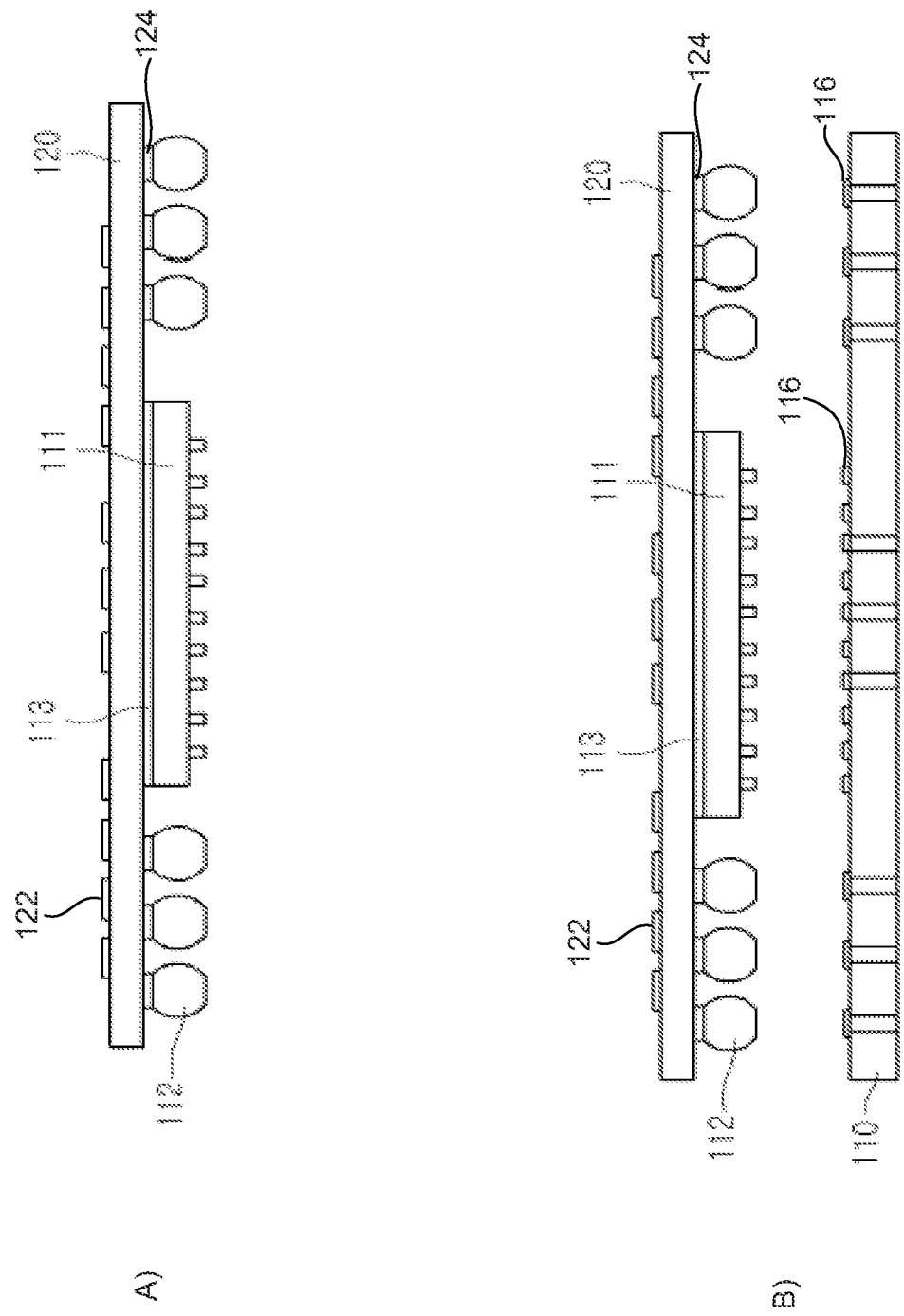
FIGS. 7A to 7E are process flow diagrams illustrating processes of manufacturing a semiconductor package, in accordance with another embodiment of the present disclosure.

Referring to FIG. 7A, a semiconductor die 111 may be attached at a target position on the bottom of an extended substrate 120 using an adhering member 113. The semiconductor die 111 may be attached with chip pads (or bond pads) of the semiconductor die 111 facing the opposite direction of the extended substrate 120. The adhering member 113 may, for example, comprise a heat-conductive and/or electrically conductive epoxy. Also for example, the adhering member 113 may comprise a thermal interface material. Further for example, the adhering member 113 may comprise an insulating adhesive material. The adhering member 113, for example, may comprise one or more of a laminate film, a thermal hardening liquid adhesive, and/or an NCF (Non Conductive Film) adhesive.

A plurality of bottom conductive bumps 112 may be formed on top connecting pads 124 of the extended substrate 120. The bottom conductive bumps 112 may, for example, comprise any of a variety of conductive structures. For example, the bottom conductive bumps 112 may comprise conductive balls (e.g., solder balls, coated copper balls, solder-coated copper balls, gold balls, etc.), conductive posts or pillars (e.g., plated pillars, plated copper pillars, solder pillars, solder-capped pillars or posts, etc.), conductive epoxy structures, etc.

As illustrated in FIG. 7B, a bottom substrate 110 may be prepared, on which a plurality of I/O features may be formed (e.g., bottom connection pads 116). The prepared bottom substrate 110 and the extended substrate 120 may be placed in a target position (e.g., a target position for coupling the bottom substrate 110 to the extended substrate 120).

The bottom conductive bumps 112 on the extended substrate 120 and their corresponding bottom connection pads 116 on the bottom substrate 110 may then be placed in contact with each other, and chip pads (or bond pads) formed on the semiconductor die 111 and other connection pads 116 may be placed in contact with each other. It should be noted that the bottom connection pads 116 on the bottom substrate 110 may be configured for receiving the bottom conductive bumps 112 or for receiving conductive bumps on the semiconductor die 111, and as such may be formed in different processes, or the same process with different mask patterns, for example.

Figure 7C:
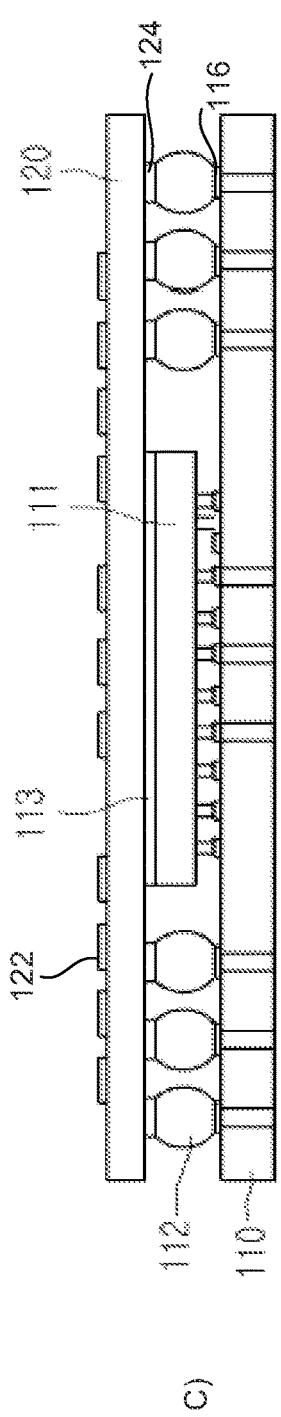

Subsequently, by performing a coupling process (e.g., a reflow and/or bonding process), the bottom substrate 110 and the extended substrate 120, as illustrated in FIG. 7C, may be physically and/or electrically coupled.

Figure 7D:
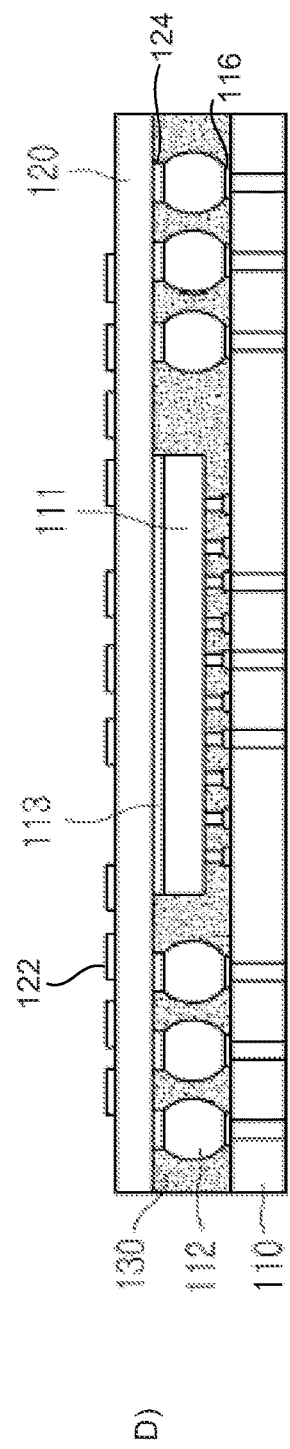

Next, by performing a molding process, the semiconductor die 111 formed between the bottom substrate 110 and the extended substrate 120, a plurality of the bottom conductive bumps 112, a plurality of the bottom connecting pads 116, and/or a plurality of the top connecting pads 124 may be encapsulated by a mold member 130, as illustrated in FIG. 7D. The mold member 130 may, for example, comprise any of a variety of mold compounds and/or be formed utilizing any of a variety of molding techniques. Additionally, through a following series of processes, a top substrate, on which a semiconductor die and a plurality of conductive bumps are formed, may be stacked on the top of the extended substrate 120.

Figure 7E:
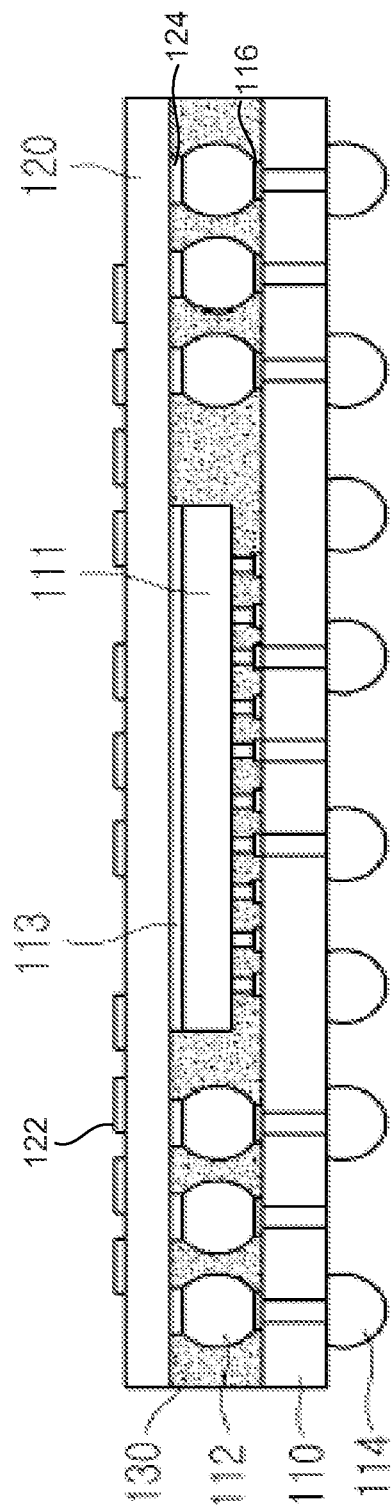

Lastly, by performing a ball drop (or placement) and a reflow process, a plurality of conductive bumps 114, as illustrated in FIG. 7E, may be formed on a plurality of connecting pads formed on the bottom of the bottom substrate 110 for physical/electrical connection to another substrate, for example a motherboard (not shown).

As set forth herein, the embodiments of the present disclosure in FIGS. 7A-7E illustrate by way of example a package structure in which a semiconductor die may be formed between a bottom substrate and an extended substrate, and a plurality of bottom conductive bumps may be encapsulated by a mold member. However, the embodiments of the present disclosure are not necessarily limited to this arrangement. It should also be understood that the embodiments may also be applied to a package structure not forming a mold member and/or not forming a mold member in the same way as in the embodiments of the present disclosure in FIG. 6.

FIGS. 8A to 8E are process flow diagrams illustrating process of manufacturing a semiconductor package, in accordance with another embodiment of the present disclosure. FIGS. 8A-8E provide an example of a manner in which the semiconductor package of FIG. 1 may be produced, and thus similar component numbering is utilized. It should be understood that similarly named and/or numbered components in FIGS. 1 and 8A-8E may, for example, share any or all characteristics with one another. Additionally, as stated herein, any or all of the aspects of FIG. 8 also apply to manufacturing semiconductor packages illustrated in FIGS. 2-5 and discussed herein.

Figures 8A, 8B, 8C:
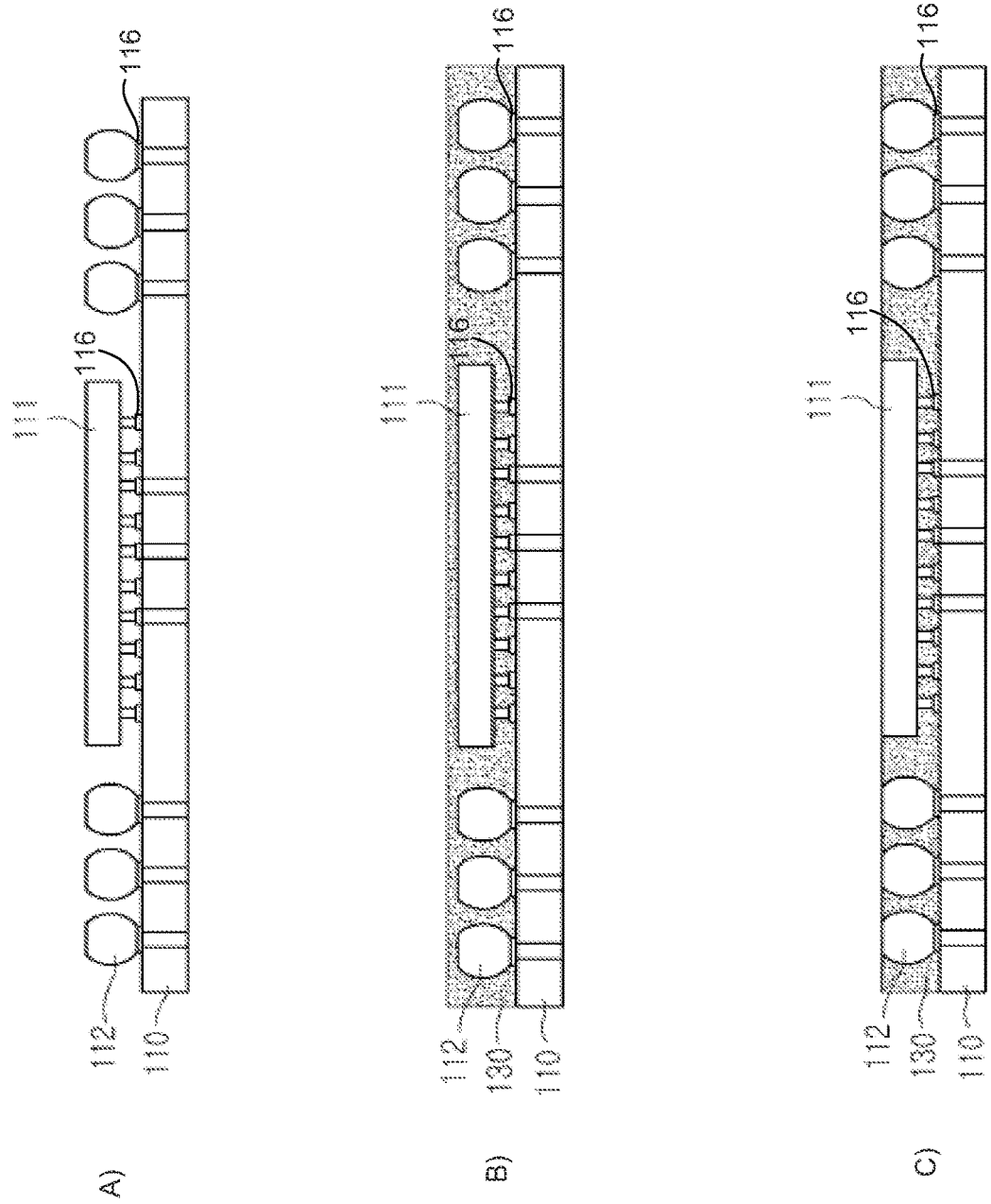
FIGS. 8A to 8E are process flow diagrams illustrating processes of manufacturing a semiconductor package, in accordance with another embodiment of the present disclosure.

Referring to FIG. 8A, a semiconductor die 111 may be attached to bottom substrate 110. The semiconductor die 111 may, for example, be attached to connecting pads 116 on the substrate. A plurality of bottom conductive bumps 112 may be formed on other connecting pads 116 of the bottom substrate 110. The method and structure shown in FIG. 8A may, for example, share any or all characteristics with the method and structure shown in FIG. 6A.

By performing a molding process, the semiconductor die 111 formed on the bottom substrate 110, a plurality of the bottom conductive bumps 112, and/or a plurality of the bottom connecting pads 116 may be encapsulated by a mold member 130 as illustrated in FIG. 8B.

Next, by removing and leveling the surface of the mold member 130 through a strip grinding process, for example, the upper surface of the semiconductor die 111 and the upper surfaces of the bottom conductive bumps 112 may be exposed, as illustrated in FIG. 8C.

Figure 8D:
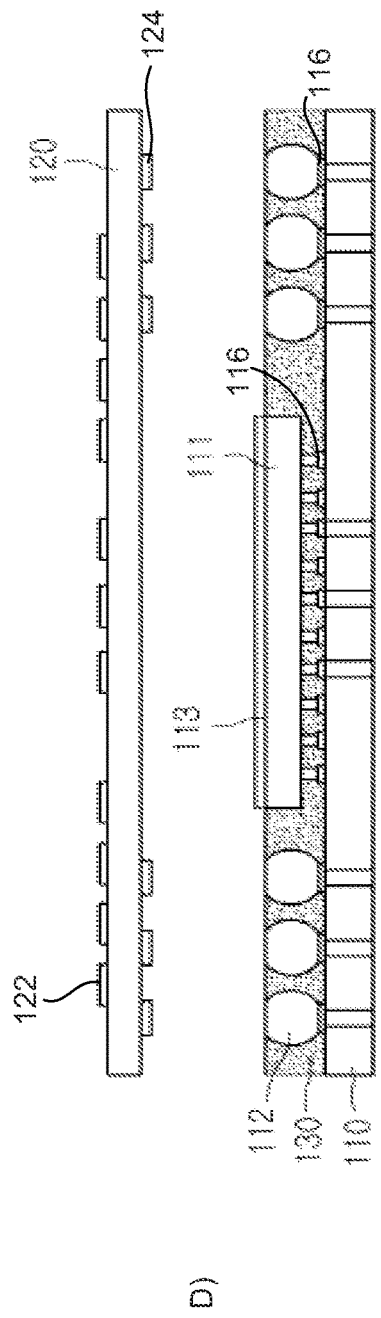

Thereafter, as illustrated in FIG. 8D, an adhering member 113 may be formed on the top of the semiconductor die 111. The adhering member 113 may, for example, comprise a heat-conductive and/or electrically conductive epoxy. Also for example, the adhering member 113 may comprise a thermal interface material. Further for example, the adhering member 113 may comprise an insulating adhesive material. The adhering member 113, for example, may comprise one or more of a laminate film, a thermal hardening liquid adhesive, and/or an NCF (Non Conductive Film) adhesive.

The extended substrate 120 may be formed, on which a plurality of top connecting pads 124 may be formed on a bottom surface of the extended substrate 120, and on which terminals 122 may be formed on a top surface of the extended substrate 120, The extended substrate 120 may be placed at a target position (e.g., a target position for coupling to the bottom substrate 110). A plurality of the top connecting pads 124 may comprise I/O features for rerouting the electrical interconnects for a plurality of bottom I/O features (e.g., the bottom connecting pads 116). It should be noted that the bottom connection pads 116 on the bottom substrate 110 may be configured for receiving the bottom conductive bumps 112 or for receiving conductive bumps on the semiconductor die 111, and as such may be formed in different processes, or the same process with different mask patterns, for example.

Figure 8E:
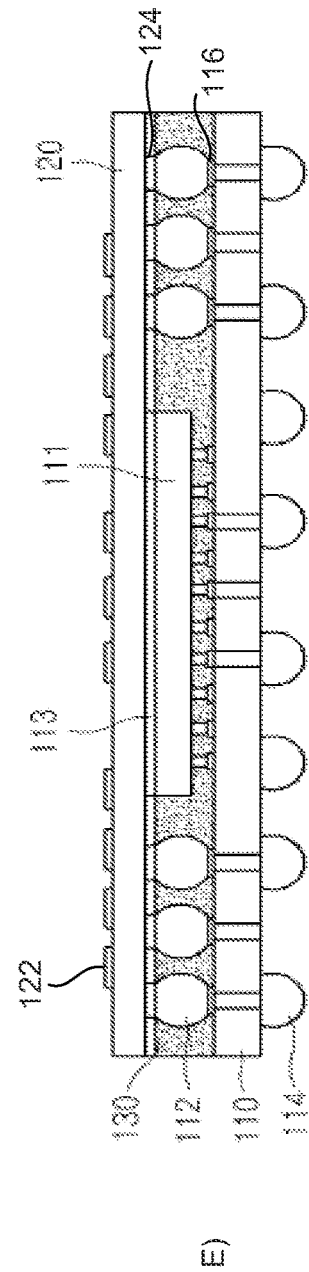

Subsequently, each top connecting pad 124 on the extended substrate 120 and its corresponding bottom conductive bump 112 on the bottom substrate 110 may be placed in contact with each other, and a bottom part of the extended substrate 120 may be placed in contact with the adhering member 113. A reflow process and a bonding process may then be performed such that the bottom substrate 110 and the extended substrate 120, may be physically coupled, as illustrated in FIG. 8E. Accordingly, the top of the semiconductor die 111 and a bottom part of the extended substrate 120 may be physically adhered (or otherwise fixed) by the adhering member 113. Additionally, through a following series of processes, a top substrate, on which a semiconductor die and a plurality of conductive bumps are formed, may be stacked on the top of the extended substrate 120. A gap between the extended substrate 120 and the mold member 130 may be filled by the adhering member 113 spreading out when the extended substrate is placed, or the gap may remain. In another example, the gap, if present, may be filled with an underfill or other compound.

Lastly, by performing a ball drop (or placement) and a reflow process, a plurality of conductive bumps 114, as illustrated in FIG. 8E, may be formed on a plurality of connecting pads formed on the bottom of the bottom substrate 110 for physical/electrical connection with another substrate, for example a motherboard (not shown).

As described herein, the embodiments of the present disclosure in FIGS. 8A-8E illustrate by way of example a package structure in which a semiconductor die may be formed between a bottom substrate and an extended substrate, and a plurality of bottom conductive bumps may be encapsulated by a mold member. However, the embodiments of the present disclosure are not necessarily limited to this arrangement. It should also be understood that the embodiments may also be applied to a package structure not forming a mold member and/or not forming a mold member in the same way as in the embodiments of the present disclosure in FIG. 6 and FIG. 7.

FIGS. 9A to 9E are process flow diagrams illustrating processes of manufacturing a semiconductor package, in accordance with another embodiment of the present disclosure. FIGS. 9A-9E provide an example of a manner in which the semiconductor package of FIG. 1 may be produced, and thus similar component numbering is utilized. It should be understood that similarly named and/or numbered components in FIGS. 1 and 9A-9E may, for example, share any or all characteristics with one another. Additionally, as stated herein, any or all of the aspects of FIG. 9 also apply to manufacturing semiconductor packages illustrated in FIGS. 2-5 and discussed herein.

Figures 9A, 9B, 9C:
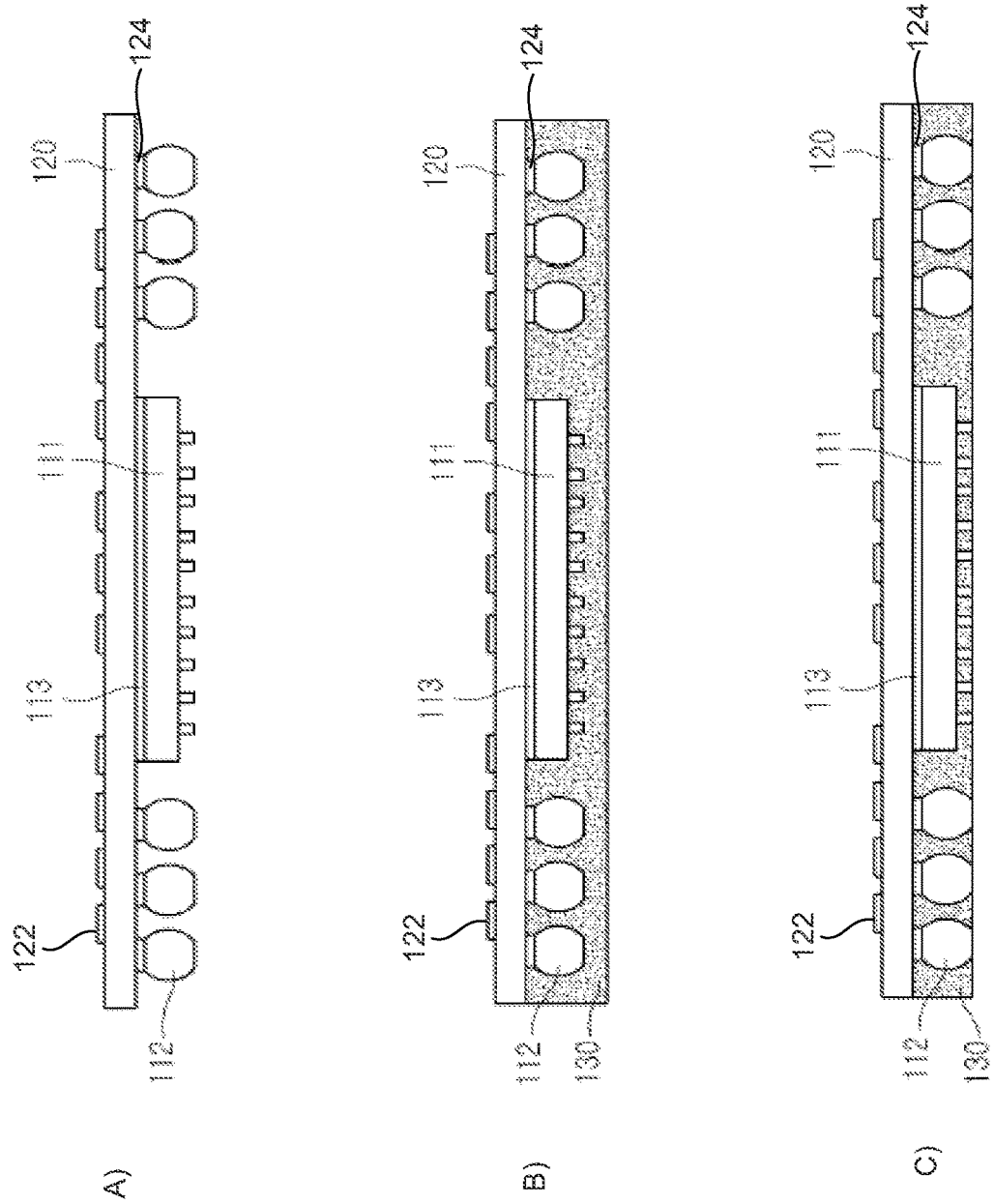
FIGS. 9A to 9E are process flow diagrams illustrating processes of manufacturing a semiconductor package, in accordance with another embodiment of the present disclosure.

Referring to FIG. 9A, a semiconductor die 111 may be attached at a target position on the bottom of an extended substrate 120 using an adhering member 113 such that the semiconductor die 111 may be attached with chip pads (or bond pads) of the semiconductor die 111 facing the opposite direction of the extended substrate 120. The adhering member 113 may, for example, comprise a heat-conductive and/or electrically conductive epoxy. Also for example, the adhering member 113 may comprise a thermal interface material. Further for example, the adhering member 113 may comprise an insulating adhesive material. The adhering member 113, for example, may comprise one or more of a laminate film, a thermal hardening liquid adhesive, and/or an NCF (Non Conductive Film) adhesive.

The extended substrate 120 may comprise top connecting pads 124 on a bottom surface of the extended substrate 120, and terminals 122 may be formed on a top surface of the extended substrate 120.

A plurality of bottom conductive bumps 112 may be formed on top connecting pads 124 of the extended substrate 120. The bottom conductive bumps 112 may, for example, comprise any of a variety of conductive structures. For example, the bottom conductive bumps 112 may comprise conductive balls (e.g., solder balls, coated copper balls, solder-coated copper balls, gold balls, etc.), conductive posts or pillars (e.g., plated pillars, plated copper pillars, solder pillars, etc.), conductive epoxy structures, etc.

By performing a molding process, the semiconductor die 111 formed on the bottom of the extended substrate 120, a plurality of the bottom conductive bumps 112, and/or a plurality of the top connecting pads 124 may be encapsulated by a mold member 130, as illustrated in FIG. 9B.

Next, by removing and leveling the surface of the mold member 130 through a strip grinding process, for example, one side (e.g., the lower surface) of chip pads formed on the semiconductor die 111 and one side (e.g., the lower surface) of the bottom conductive bumps 112 may be exposed as illustrated in FIG. 9C.

Figure 9D:
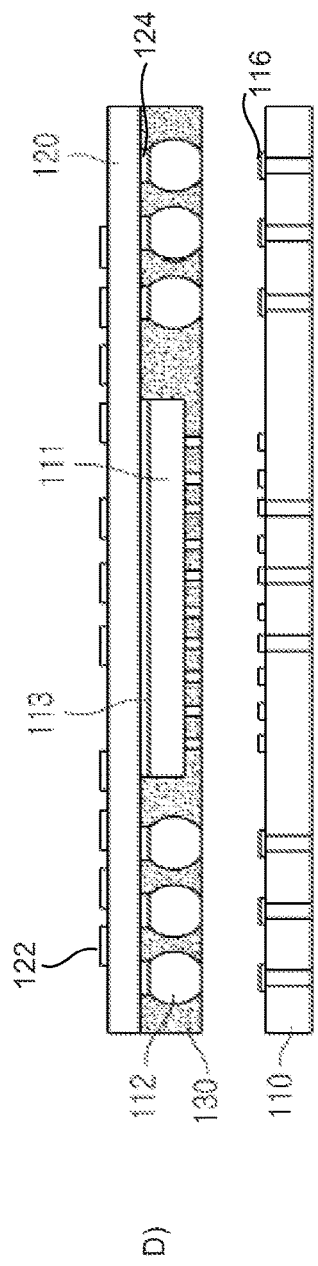

Subsequently, as illustrated in FIG. 9D, a bottom substrate 110 may be prepared, on which bottom connection pads 116 may be formed. The bottom connection pads 116 may, for example, comprise I/O features. The prepared bottom substrate 110 and the extended substrate 120 may be placed at a target position (e.g., a target position for coupling the bottom substrate 110 to the extended substrate 120). A gap between the bottom substrate 110 and the mold member 130 may be filled by the adhering member 113 spreading out when the extended substrate 120 and mold member 130 is placed, or the gap may remain. In another example, the gap, if present, may be filled with an underfill or other compound.

The bottom conductive bumps 112 on the extended substrate 120 and their corresponding bottom connection pads 116 on the bottom substrate 110 may then be placed in contact with each other, and the chip pads (or bond pads) formed on the semiconductor die 111 may be placed in contact with bottom connection pads 116 on the bottom substrate 110. It should be noted that the bottom connection bumps 116 on the bottom substrate 110 may be configured for receiving the bottom conductive bumps 112 or for receiving conductive bumps on the semiconductor die 111, and as such may be formed in different processes, or the same process with different mask patterns, for example.

Figure 9E:
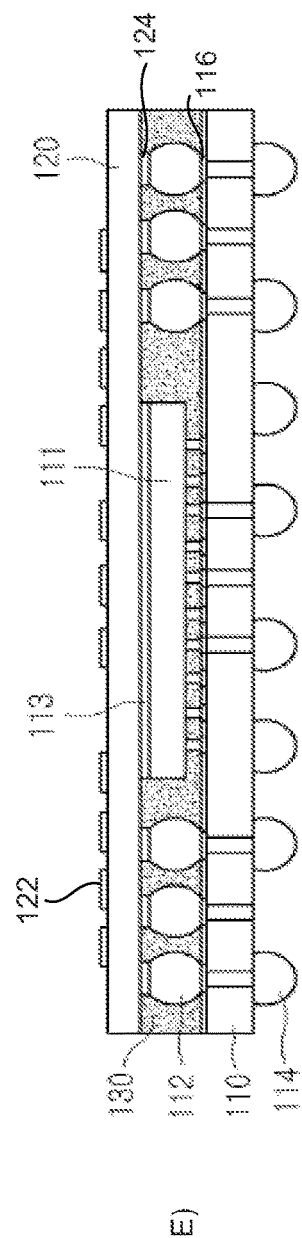

Subsequently, by performing a coupling process (e.g., a reflow and/or bonding process), the bottom substrate 110 and the extended substrate 120, as illustrated in FIG. 9E, may be physically and/or electrically coupled. Additionally, through a following series of processes, a top substrate, on which a semiconductor die and a plurality of conductive bumps are formed, may be stacked on the top of the extended substrate 120.

Lastly, by performing a ball drop (or placement) and reflow process, a plurality of conductive bumps 114 may be formed on a plurality of connecting pads formed on the bottom of the bottom substrate 110 for physical/electrical connection to another substrate, for example a motherboard-board (not shown), as illustrated in FIG. 9E for example.

As described herein, the embodiments of the present disclosure in FIGS. 9A-9E illustrate by way of example a package structure in which a semiconductor die may be formed between a bottom substrate and an extended substrate and a plurality of bottom conductive bumps may be encapsulated by a mold member. However, the embodiments of the present disclosure are not necessarily limited to this arrangement. It should be understood that the embodiments may also be applied to a package structure not forming a mold member and/or not forming a mold member in the same way as in the embodiments of the present disclosure in FIGS. 6 to 8.

While the embodiments of the present disclosure illustrated in FIGS. 6 to 9 explain that two substrates may be connected electrically using a conductive bump comprising a single ball, the embodiments of the present disclosure are not necessarily limited thereto. As illustrated in FIGS. 2 to 5, it will be appreciated to those skilled in the art that the embodiments may be applied in the same way to a package structure in which two substrates are connected electrically through a ball-to-ball method, a ball-to-post method, a post-to-ball method, a post-to-post method, etc.

This disclosure provides example embodiments supporting the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure. For example, while the disclosure references an adhesive member, it should be understood that other types of coupling or fixing members not involving adhesion per se may also be used.

In an example embodiment of the disclosure, a method for manufacturing a semiconductor device having a semiconductor die within an extended substrate and a bottom substrate may include bonding a bottom surface of a semiconductor die to a top surface of a bottom substrate, forming an adhering member to a top surface of the semiconductor die, bonding an extended substrate to the semiconductor die and to the top surface of the bottom substrate utilizing the adhering member and a conductive bump on a bottom surface of the extended substrate and a conductive bump on the bottom substrate. The semiconductor die and the conductive bumps may be encapsulated utilizing a mold member. The conductive bump on the bottom surface of the extended substrate may be electrically connected to a terminal on the top surface of the extended substrate. The adhering member may include a laminate film, a non-conductive film adhesive, or a thermal hardening liquid adhesive.

In another example scenario, a bottom surface of a semiconductor die may be bonded to a top surface of a bottom substrate, the top surface of the bottom substrate comprising a conductive bump, the semiconductor die and the solder bump may be encapsulated utilizing a mold member, and the mold member may be thinned to expose a top surface of the semiconductor die and a top of the conductive bump. An adhering member may be formed on the top surface of the semiconductor die, and a bottom surface of an extended substrate may be bonded to the semiconductor die utilizing the adhering member and also bonded to the bottom substrate utilizing the exposed conductive bump. The conductive bump may be electrically connected to a terminal on a top surface of the extended substrate. The adhering member may comprise one or more of: a laminate film, a non-conductive film adhesive, and a thermal hardening liquid adhesive. The conductive bump may comprise a solder ball or a copper ball with solder-coated surface. The conductive bump may comprise a solder ball on a conductive post. The conductive bump may comprise a solder ball on a copper post.

While various aspects of the present disclosure have been described with reference to certain supporting embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor device comprising:
a first substrate comprising a top surface and a bottom surface;
a semiconductor die comprising a top surface and a bottom surface, wherein the bottom surface of the semiconductor die is bonded to the top surface of the first substrate;
a second substrate comprising a top surface and a bottom surface;
an adhering member between the bottom surface of the second substrate and the top surface of the semiconductor die;
a solder-coated copper ball coupling the bottom surface of the second substrate to the top surface of the first substrate; and
a mold member that encapsulates the semiconductor die and the solder-coated copper ball,
wherein:
the adhering member extends beyond a footprint of the semiconductor die, and
a lateral side of the adhering member is located between a lateral side of the solder-coated copper ball and a lateral side of the semiconductor die.

2. The semiconductor device according to claim 1, wherein the solder-coated copper ball is directly coupled to a first connecting pad on the first substrate and to a second connecting pad on the second substrate.

3. The semiconductor device according to claim 1, comprising a terminal on the top surface of the second substrate.

4. The semiconductor device according to claim 3, wherein the solder-coated copper ball is electrically connected to the terminal.

5. The semiconductor device according to claim 3, wherein the second substrate comprises an interposer.

6. The semiconductor device according to claim 1, wherein the adhering member comprises a laminate film.

7. The semiconductor device according to claim 1, wherein the adhering member comprises one of: a non-conductive film adhesive and a thermal hardening liquid adhesive.

8. The semiconductor device according to claim 1, wherein the top surface of the first substrate comprises an uppermost surface of the first substrate, and the solder-coated copper ball comprises a bottom end that is no lower than the uppermost surface of the first substrate.

9. The semiconductor device according to claim 1, wherein a topmost surface of the mold member is coplanar with a topmost surface of the solder-coated copper ball.

10. The semiconductor device according to claim 1, comprising a plurality of conductive bumps on the bottom surface of the first substrate.

11. A semiconductor device comprising:
a first substrate comprising a top surface and a bottom surface;
a semiconductor die comprising a top surface and a bottom surface;
metal contacts coupling the bottom surface of the semiconductor die to the top surface of the first substrate;
a second substrate comprising a top surface and a bottom surface;
an adhering member between the bottom surface of the second substrate and the top surface of the semiconductor die, wherein the adhering member extends beyond a footprint of the semiconductor die;
a solder-coated copper ball coupling the bottom surface of the second substrate to the top surface of the first substrate; and
a mold member that encapsulates the semiconductor die and the solder-coated copper ball.

12. The semiconductor device according to claim 11, wherein the solder-coated copper ball is directly coupled to a first connecting pad on the first substrate and to a second connecting pad on the second substrate.

13. The semiconductor device according to claim 11, comprising a terminal on the top surface of the second substrate.

14. The semiconductor device according to claim 13, wherein the solder-coated copper ball is electrically connected to the terminal.

15. The semiconductor device according to claim 13, wherein the second substrate comprises an interposer.

16. The semiconductor device according to claim 11, wherein the adhering member comprises a laminate film.

17. The semiconductor device according to claim 11, wherein the adhering member comprises one of: a non-conductive film adhesive and a thermal hardening liquid adhesive.

18. The semiconductor device according to claim 11, wherein the top surface of the first substrate comprises an uppermost surface of the first substrate, and the solder-coated copper ball comprises a bottom end that is no lower than the uppermost surface of the first substrate.

19. The semiconductor device according to claim 11, wherein a topmost surface of the mold member is coplanar with a topmost surface of the solder-coated copper ball.

20. The semiconductor device according to claim 11, comprising a plurality of conductive bumps on the bottom surface of the first substrate.

* * * * *